United States Patent
Bai et al.

(10) Patent No.: US 10,115,606 B2
(45) Date of Patent: Oct. 30, 2018

(54) METHODS OF PROMOTING ADHESION BETWEEN UNDERFILL AND CONDUCTIVE BUMPS AND STRUCTURES FORMED THEREBY

(71) Applicant: Intel Corporation, Santa Clara, CA (US)

(72) Inventors: Yiqun Bai, Chandler, AZ (US); Yuying Wei, Chandler, AZ (US); Arjun Krishnan, Chandler, AZ (US); Suriyakala Ramalingam, Chandler, AZ (US); Yonghao Xiu, Chandler, AZ (US); Beverly J. Canham, Mesa, AZ (US); Sivakumar Nagarajan, Chandler, AZ (US); Saikumar Jayaraman, Chandler, AZ (US); Nisha Ananthakrishnan, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/139,265

(22) Filed: Apr. 26, 2016

(65) Prior Publication Data
US 2016/0240395 A1 Aug. 18, 2016

Related U.S. Application Data

(62) Division of application No. 13/721,266, filed on Dec. 20, 2012, now Pat. No. 9,330,993.

(51) Int. Cl.
*H01L 23/48* (2006.01)
*H01L 23/52* (2006.01)
*H01L 23/28* (2006.01)
*H01L 21/56* (2006.01)
*H01L 23/29* (2006.01)
*H01L 23/00* (2006.01)

(52) U.S. Cl.
CPC .......... *H01L 21/563* (2013.01); *H01L 23/293* (2013.01); *H01L 23/295* (2013.01); *H01L 23/296* (2013.01); *H01L 24/13* (2013.01); *H01L 2224/16225* (2013.01); *H01L 2224/29647* (2013.01); *H01L 2224/32225* (2013.01); *H01L 2224/73204* (2013.01)

(58) Field of Classification Search
CPC ......... H01L 21/56; H01L 23/42; H01L 23/48; H01L 23/52
USPC ..... 257/E23.001, E21.499, E23.085; 438/15, 438/25, 26, 51, 55, 64, 106, 118, 119; 428/65.2, 317.1, 832.4, 317.7, 355 R, 428/FOR. 141
See application file for complete search history.

(56) References Cited

U.S. PATENT DOCUMENTS 5,508,229 A * 4/1996 Baker .................. C23F 1/16
                                                           148/DIG. 131
5,942,073 A   8/1999 Mowrer et al. ............ 156/329

(Continued)

*Primary Examiner* — Sheikh Maruf
(74) *Attorney, Agent, or Firm* — Schwabe, Williamson & Wyatt, P.C.

(57) ABSTRACT

Methods of forming a microelectronic packaging structure and associated structures formed thereby are described. Those methods and structures may include modifying an underfill material with one of a thiol adhesion promoter, an azole coupling agent, surface modified filler, and peroxide based cross-linking polymer chemistries to greatly enhance adhesion in package structures utilizing the embodiments herein.

23 Claims, 11 Drawing Sheets

(56) References Cited

U.S. PATENT DOCUMENTS

| Patent/Publication | Date | Inventor | Classification |
|---|---|---|---|
| 5,982,629 A * | 11/1999 | Shoji | H01L 21/4853 228/180.22 |
| 6,165,885 A * | 12/2000 | Gaynes | B23K 1/0016 257/737 |
| 6,620,512 B2 * | 9/2003 | Jayaraman | C08G 59/4261 257/E21.503 |
| 6,882,058 B2 * | 4/2005 | Chan | C09J 11/06 257/787 |
| 2002/0014703 A1 * | 2/2002 | Capote | B23K 35/025 257/778 |
| 2003/0157792 A1 * | 8/2003 | Tong | H01L 24/11 438/614 |
| 2003/0218258 A1 * | 11/2003 | Charles | H01L 21/563 257/783 |
| 2004/0262750 A1 * | 12/2004 | Jayaraman | C08G 59/504 257/734 |
| 2005/0263888 A1 * | 12/2005 | Jiang | H01L 21/563 257/738 |
| 2006/0060956 A1 * | 3/2006 | Tanikella | H01L 21/4857 257/686 |
| 2006/0073344 A1 * | 4/2006 | Jayaraman | B23K 35/3613 428/414 |
| 2006/0214153 A1 * | 9/2006 | Ikezawa | H01L 21/563 257/40 |
| 2006/0230614 A1 | 10/2006 | Imamura et al. | 29/890.1 |
| 2007/0152311 A1 * | 7/2007 | Jayaraman | H01L 21/563 257/678 |
| 2007/0274060 A1 | 11/2007 | Kiuchi et al. | 361/820 |
| 2007/0284758 A1 * | 12/2007 | Zhang | H01L 21/563 257/780 |
| 2008/0017975 A1 * | 1/2008 | Deppisch | H01L 23/42 257/706 |
| 2008/0039608 A1 * | 2/2008 | Mills | C07D 407/14 528/37 |
| 2008/0096046 A1 * | 4/2008 | Yamashita | C23C 8/02 428/655 |
| 2008/0099141 A1 | 5/2008 | Booth et al. | 156/331.7 |
| 2008/0110530 A1 * | 5/2008 | Wilson | H01L 21/563 148/23 |
| 2008/0142992 A1 * | 6/2008 | Mahler | H01L 21/563 257/778 |
| 2008/0150170 A1 * | 6/2008 | Manepalli | C08G 59/42 257/795 |
| 2009/0236756 A1 | 9/2009 | Kim et al. | 257/778 |
| 2009/0264602 A1 | 10/2009 | Mori et al. | 525/431 |
| 2009/0302280 A1 * | 12/2009 | Simone | C07F 7/0854 252/512 |
| 2010/0007018 A1 * | 1/2010 | Wyatt | H01L 24/73 257/737 |
| 2010/0163293 A1 * | 7/2010 | Kawai | H05K 1/113 174/261 |
| 2010/0279121 A1 | 11/2010 | Burckhardt et al. | 428/423.1 |
| 2010/0314352 A1 * | 12/2010 | Chen | H01L 21/6835 216/13 |
| 2010/0330780 A1 | 12/2010 | Hwang et al. | 438/464 |
| 2011/0147048 A1 * | 6/2011 | Yamamoto | H05K 3/282 174/126.1 |
| 2011/0147072 A1 * | 6/2011 | Yamashita | C23F 1/02 174/268 |
| 2011/0220269 A1 * | 9/2011 | Schwoeppe | C03C 27/048 156/108 |
| 2011/0241228 A1 * | 10/2011 | Enomoto | C08G 59/4071 257/793 |
| 2012/0074597 A1 * | 3/2012 | Xu | C08L 23/0884 257/783 |
| 2012/0163749 A1 * | 6/2012 | Huang | G02B 6/12004 385/3 |
| 2012/0181673 A1 * | 7/2012 | Pagaila | H01L 21/568 257/659 |
| 2012/0193783 A1 * | 8/2012 | Hong | H01L 23/3128 257/737 |
| 2012/0205820 A1 * | 8/2012 | Oda | H01L 21/563 257/778 |
| 2012/0306103 A1 * | 12/2012 | Yoshimura | H01L 25/0657 257/777 |
| 2013/0277813 A1 | 10/2013 | Torwesten et al. | 257/676 |
| 2013/0299965 A1 * | 11/2013 | Gandhi | H01L 23/3142 257/737 |
| 2013/0307139 A1 * | 11/2013 | Chen | B23K 20/023 257/737 |
| 2013/0328217 A1 * | 12/2013 | Takamoto | H01L 21/561 257/778 |
| 2014/0187659 A1 * | 7/2014 | Horiguchi | H01L 24/29 521/146 |
| 2014/0264827 A1 * | 9/2014 | Prakash | C08K 5/005 257/737 |

\* cited by examiner

METHODS OF PROMOTING ADHESION BETWEEN UNDERFILL AND CONDUCTIVE BUMPS AND STRUCTURES FORMED THEREBY

This is a Divisional Application of application Ser. No. 13/721,266 filed Dec. 20, 2012, which is hereby incorporated by reference.

BACKGROUND OF THE INVENTION

As microelectronic packaging technology advances for higher processor performance, improving adhesion between package underfill materials and connective interconnect materials, such as copper bump material, remains an important issue. Adhesion between the two materials can be challenging due to a tendency to have very poor chemical bonding as well as coefficient of thermal expansion (CTE) mismatch between such materials as copper and epoxy. In fact, delamination between an underfill material and copper surfaces may occur under high mechanical and thermal stress conditions. Such delamination can propagate in an upwards direction and can cause package passivation layers to crack, or the delamination may propagate in a downwards direction and can cause solder resist materials to crack, which may further result in copper trace cracking at a package substrate level. Delamination in either direction can lead to package electrical failure and reliability issues.

BRIEF DESCRIPTION OF THE DRAWINGS

While the specification concludes with claims particularly pointing out and distinctly claiming certain embodiments, the advantages of these embodiments can be more readily ascertained from the following description of the invention when read in conjunction with the accompanying drawings in which:

DETAILED DESCRIPTION OF THE PRESENT INVENTION

In the following detailed description, reference is made to the accompanying drawings that show, by way of illustration, specific embodiments in which the methods and structures may be practiced. These embodiments are described in sufficient detail to enable those skilled in the art to practice the embodiments. It is to be understood that the various embodiments, although different, are not necessarily mutually exclusive. For example, a particular feature, structure, or characteristic described herein, in connection with one embodiment, may be implemented within other embodiments without departing from the spirit and scope of the embodiments. In addition, it is to be understood that the location or arrangement of individual elements within each disclosed embodiment may be modified without departing from the spirit and scope of the embodiments. The following detailed description is, therefore, not to be taken in a limiting sense, and the scope of the embodiments is defined only by the appended claims, appropriately interpreted, along with the full range of equivalents to which the claims are entitled. In the drawings, like numerals may refer to the same or similar functionality throughout the several views.

Methods and associated structures of forming and utilizing microelectronic structures, such as underfill structures associated with various package structures, are described. Those methods/structures may include forming an underfill material on conductive bumps of the package structure, wherein the underfill material comprises one of a high molecular weight thiol based adhesion promoter with electron withdrawing groups and an azole based coupling agent. The underfill material may also comprise heterocyclic compounds comprising nitrogen and sulfur. The underfill structures of the various embodiments disclosed herein greatly improve the adhesion of the underfill material to conductive bumps of packaging structures.

Figure 1A:
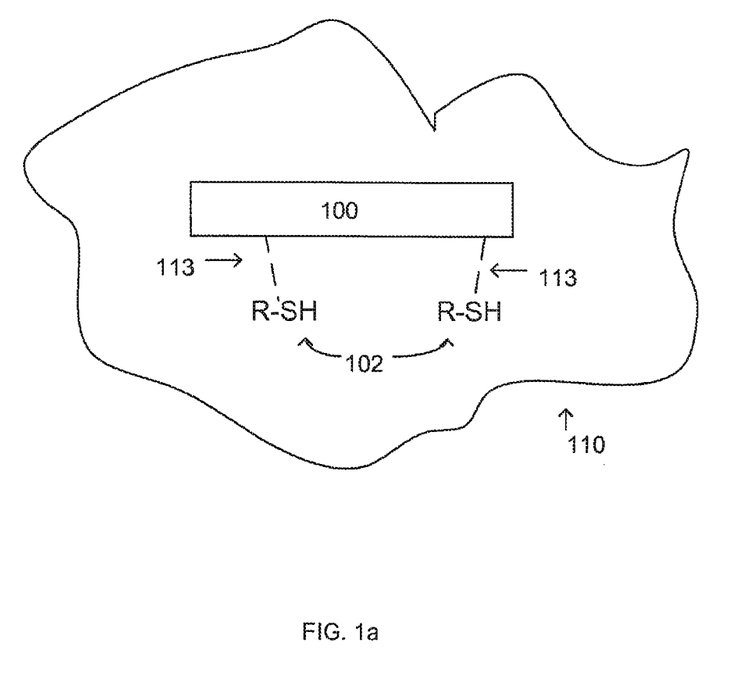
FIGS. 1a-1c represent cross sectional views structures according to various embodiments.

FIGS. 1a-1f illustrate embodiments of forming microelectronic structures, such as a package structures with underfill material that enhances adhesion between conductive bumps and the underfill material (FIG. 1a, cross-sectional view). In an embodiment, a conductive bump structure 100 may be surrounded with an underfill material 110, which may comprise an epoxy containing underfill material 110, in some cases. The underfill material 110 may comprise a thiol adhesion promoter 102. The thiol adhesion promoter may be added to the underfill material 110 during a formation process/manufacturing process of the underfill material 110. The thiol adhesion promoter 102 may comprise a high molecular weight, wherein the thiol adhesion promoter may comprise a molecular weight of greater than about 150 g/mol, in some cases.

The thiol adhesion promoter 102 may comprise electron withdrawing groups, such as thiol containing groups (SH groups) in some embodiments, but other types of high molecular weight materials with electron withdrawing groups may be suitable, depending upon the particular application. In an embodiment, the adhesion promoter may comprise high molecular weight thiol with carbonyl group and mecapthosilane, for example. The thiol based adhesion promoters 102 may comprise low outgassing characteristics, no unpleasant odor, and strong bonding properties to the conductive bumps 100 in some embodiments. The bonds 113 between the conductive bumps 100, which may comprise copper conductive bump structures 100 in an embodiment, but may comprise other materials in other embodiments, comprise an improvement in bond strength between the conductive bump 100 and the underfill material 110.

The electron withdrawing groups and larger molecular weights of the thiol adhesion promoters 102, which may comprise carbonyl electron withdrawing groups in embodiments, may remove electrons from the conductive bumps 100, in an embodiment. The thiol adhesion promoters 102 of the embodiments herein enhance the strength of the bond 113 and thus prevent delamination and improve adhesion between the underfill material 110 and the conductive bumps 100. Such delamination may occur under high mechanical and thermal stress conditions of a microelectronic device/package structure comprising the conductive bumps 100 and underfill 110, such as a microelectronic package structure comprising the underfill material 110.

Figure 6A:
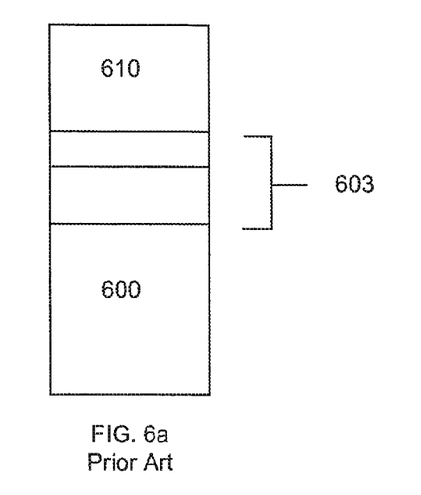
FIG. 6a-6b represent cross-sectional views of structures according to the Prior Art.
Figure 6B:
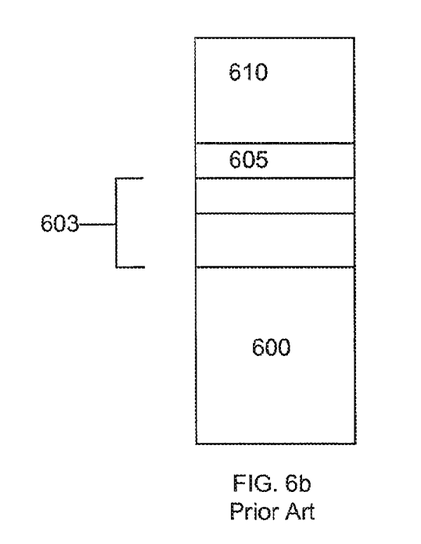

In prior art structures wherein a conductive bump structure 600 may be exposed to a prior art underfill material 610 (FIG. 6a, a cross-sectional view, Prior Art), different metal oxide layers 603 may be present on a surface of the conductive bump, such as copper oxides (CuO and $Cu_2O$). Additional metal/conductive oxide materials 605 may be present as well on the conductive bump structure 600, such as tin oxide ($SnO_2$) for example (FIG. 6b, a cross-sectional view). In an embodiment, $SnO_2$ and $CuO_2$ may comprise n-type metal oxides, while CuO can be either n-type or p-type. Such oxides 603, 605 may prevent good adhesion and cause delamination and cracking between the prior art underfill material 610 and the conductive bump 600.

Figure 5:
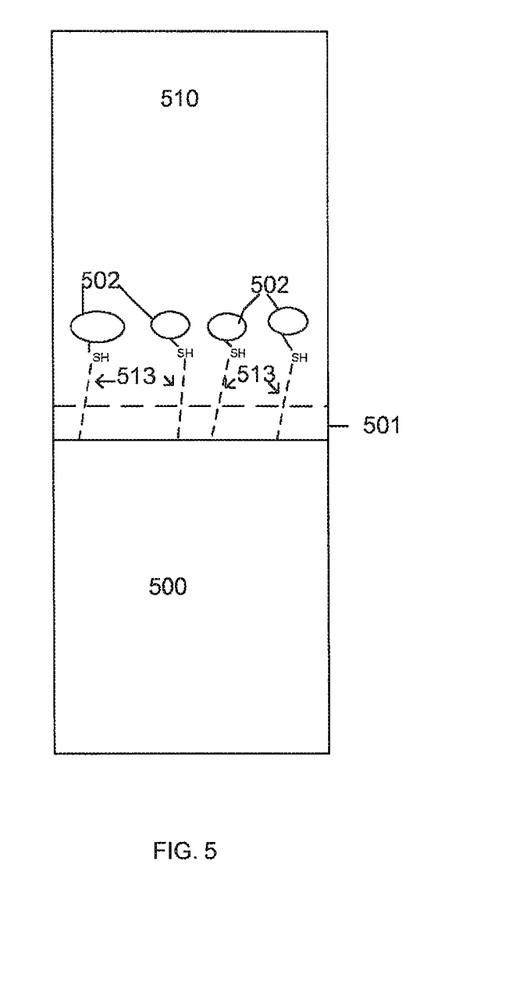
FIG. 5 represents a cross-sectional view of a structure according to various embodiments.

An underfill material 510 comprising a thiol adhesion promoter 502 (FIG. 5, a cross-sectional view) can improve adhesion and prevent delamination by forming strong covalent bonds 513 between the thiol adhesion promoter 502 of the underfill material 510 and the conductive bump structure 500. In an embodiment, the strong bonding 513 is achieved because the thiol adhesion promoter 502 comprises electron withdrawing groups which may induce a partial electrostatic attraction upon drawing/removing electrons from the conductive bump structure, which may comprise copper in some cases. In an embodiment, a metal oxide layer 501 may be present on the conductive bump surface, wherein the bonding 513 reduces an amount of metal oxide 501 due to enhanced bonding 513, and in other embodiments, the metal oxide layer 501 may not be substantially present due to enhanced bonding 513.

In another embodiment, adhesion between the conductive bump 100 and the underfill material 110 may be enhanced by the addition of an azole based coupling agent 104, wherein the azole coupling agent 104 may comprise compounds, such as hetero cyclic compounds in some cases, which comprise nitrogen and/or sulfur electron donor groups. The azole coupling agent 104 may comprise such compounds as Benzotriazole (BTA) or other heterocyclic compounds comprising nitrogen and or sulfur. In other embodiments, azole coupling agents may include benzotriazole-5-carboxylic acid (CBTA), imidazole, 8-azaadenine and/or other heterocyclic compounds.

Figure 1B:
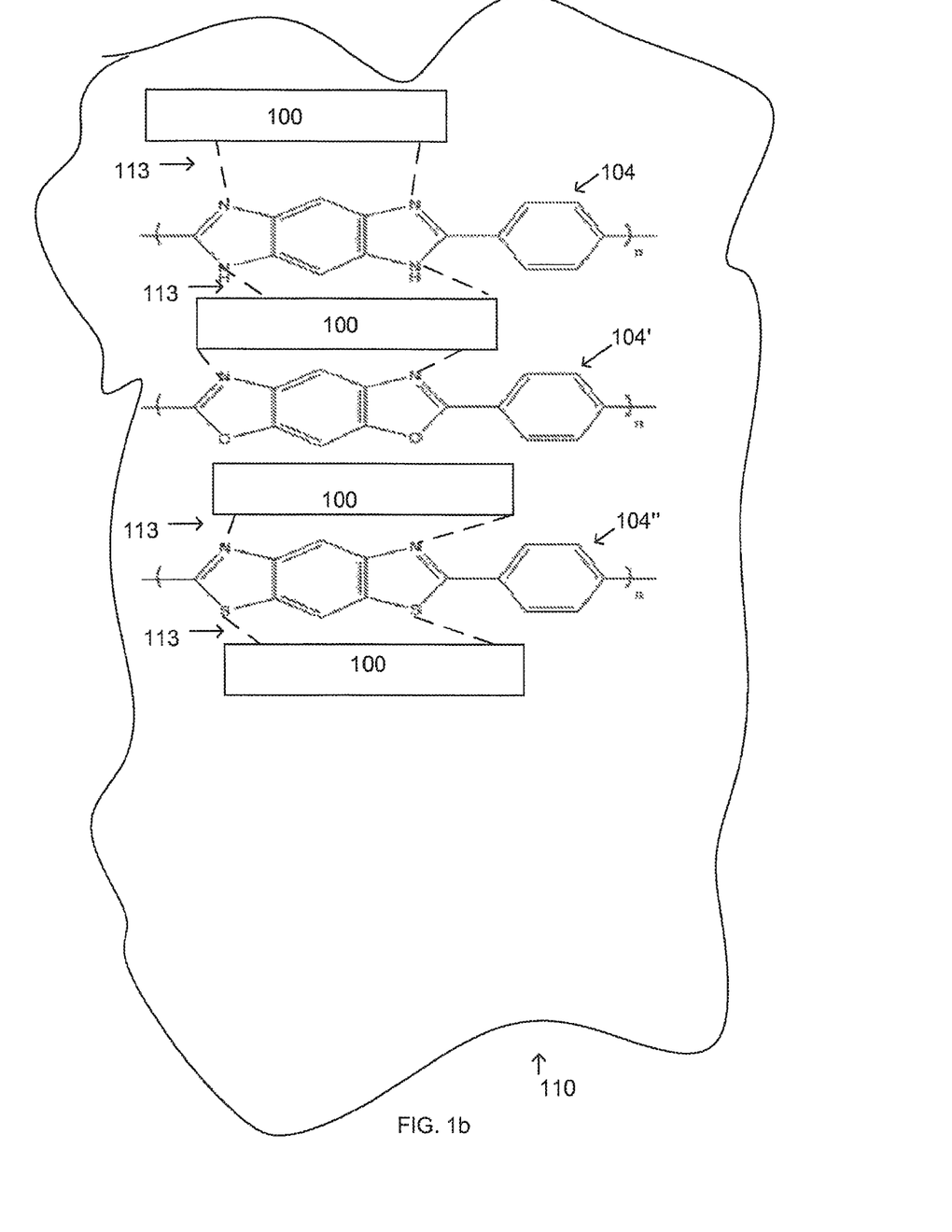

Additionally, the azole based coupling agents 104 may comprise polymers such polybenzimidazole 104, polybenzoxazole (PBO) 104' and polybenzthiazole (PBT) 104" (FIG. 1b, a cross-sectional view). In an embodiment, the azole based coupling agents 104 can be can be included with the underfill material 110 formulation. Alternatively, PBO and/or PBT 104', 104" precursors may be added to an uncured underfill formulation and co-cured with the underfill material 110. In an embodiment, vacant d-orbitals in the conductive bump 100, such as in a copper conductive bump 100, may form coordinative bonds with the azole coupling agent 104 (which is not limited to the polymeric examples of FIG. 1b), wherein the nitrogen and/or sulfur atoms of the azole coupling agent 104 may donate electrons to the bonds 113. In another embodiment, in the case of sulfur donation of electrons to the bonds 113, carbon-sulfur-copper covalent linkages may be formed which improve adhesion of the underfill 110 and the conductive bump 100.

In another embodiment, a filler may be added to the underfill material 110. The filler, which may comprise a micro filler and/or a nano filler in some cases, may be surface treated with an azole based coupling agents and/or a thiol based adhesion promoter to improve adhesion between the underfill material 110 and the conductive bump 100.

Figure 1C:
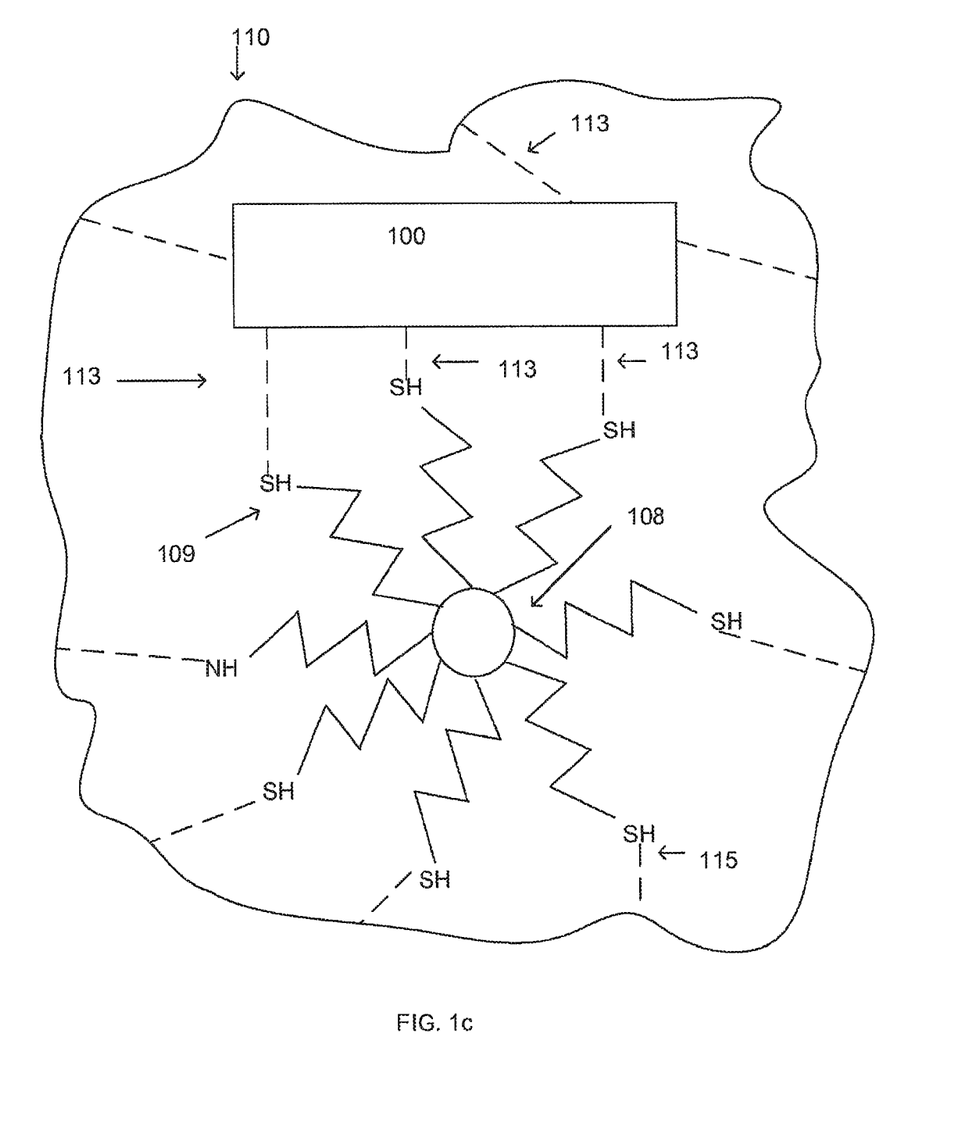

In an embodiment, a filler may undergo a surface modification treatment/process with a thiol and/or an azole based chemistry. In an embodiment, the filler may be treated with a mecaptopsilane or other thiol or azole based chemistry, for example. In FIG. 1c, (a cross-sectional view), a filler 108 may comprise azole and/or thiol surface components comprising nitrogen and/or sulfur 109. These surface components form bonds 113 with the conductive bump structures 100, and may additionally form bonds 115 with the underfill material 110 itself.

Because the filler 108, which may comprise silica, for example, makes contact to the conductive bump 100 surface, adhesion is greatly improved between the underfill 110 and the conductive bump 100 with the surface modification of the filler 108. Additionally, as the filler 108 size is reduced, the contact area between the filler 108 and the conductive bump 100 surface increases, thus improving adhesion. In an embodiment, the odor issues associated with prior art underfill materials are alleviated since substantially all the thiol groups may be bonded to the silica containing filler 108 surfaces.

In another embodiment, peroxide based cross-linking chemistry may be added to the underfill material to improve the adhesion between the conductive bump and the underfill material 110. In an embodiment, polyolefin based peroxide formulations may form cross-links on metal oxide surfaces, such as tin oxide surfaces. For example, in many package structures, tin from solder structures located in a package substrate may wick up to the conductive bump surface. The surface of the conductive bump may then comprise metal oxides, which may be a combination of copper and tin oxides in some cases.

With the addition of the peroxide to the various embodiments of underfill material herein, peroxide cross-linking will impart good adhesion between the conductive bump 100 and the underfill material 110. Many package structures are known to fail (crack and/or delaminate) at the underfill and bump interface. These failures may be due to both adhesive and cohesive failures. Peroxide cross-linking imparts a higher cross-linking density within a resin system, which can reduce cohesive failure. In addition, more oxygen in the acrylic resin backbone which uses peroxide linking can increase bonding sites within the conductive bump, thus increasing the adhesion strength between the underfill material and the conductive bump.

Figure 1D:
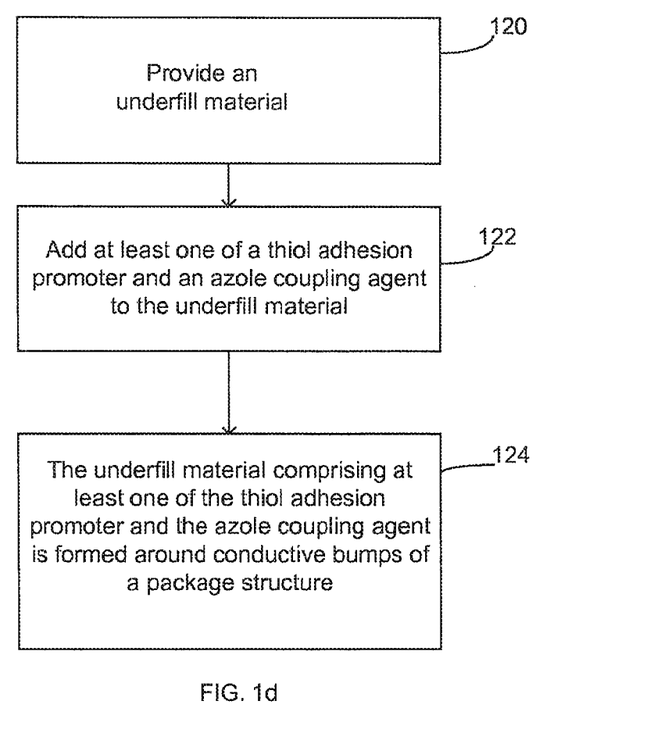
FIGS. 1d-1f represent flow charts of methods according to embodiments.

FIG. 1d depicts a flow chart a method according to an embodiment. At step 120, an underfill material is provided. At step 122, at least one of a thiol adhesion promoter and an azole coupling agent is added to the underfill material. At step, 124, the underfill material comprising at least one of the thiol adhesion promoter and the azole coupling agent is formed around/on conductive bumps of a package structure.

Figure 1E:
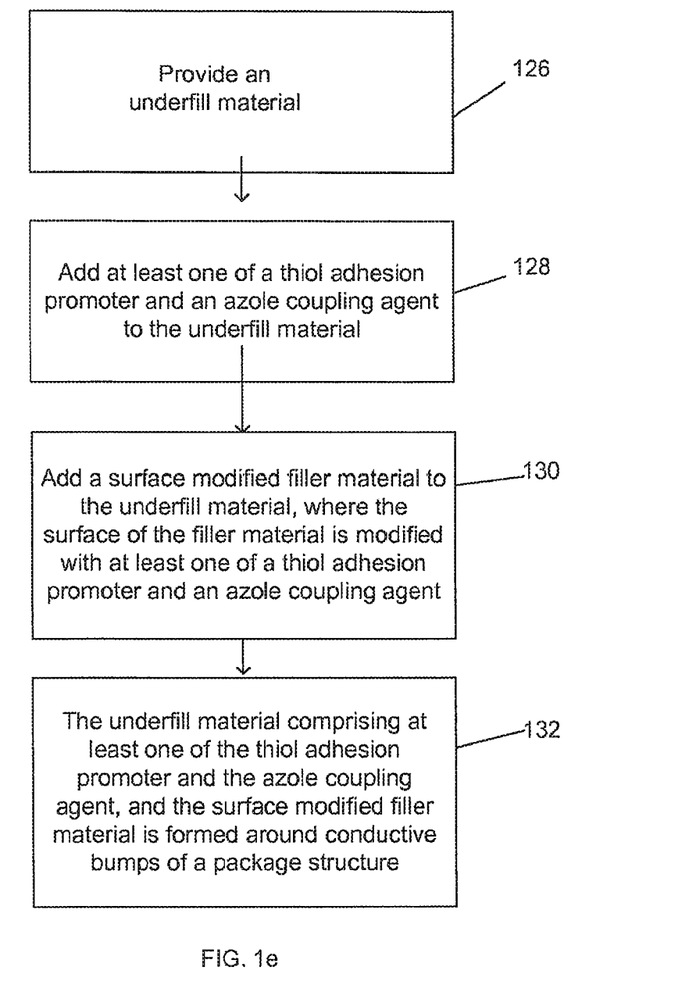

FIG. 1e depicts a flow chart of a method according to an embodiment. At step 126, an underfill material is provided. At step 128, at least one of a thiol adhesion promoter and an azole coupling agent is added to the underfill material. At step 130, a surface modified filler material is added to the underfill material, wherein the surface of the filler material is modified with at least one of a thiol adhesion promoter and an azole coupling agent. At step 132, the underfill material comprising at least one of the thiol adhesion promoter and the azole coupling agent, and the surface modified filler is formed around/on conductive bumps of a package structure.

Figure 1F:
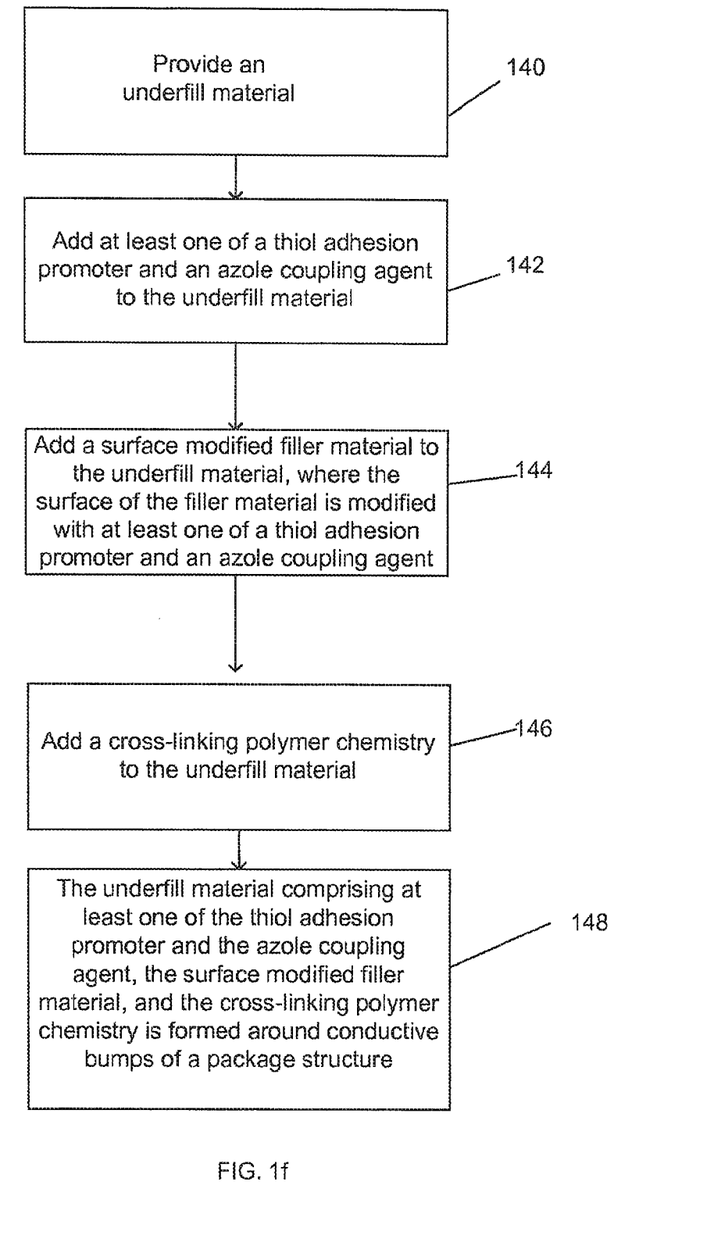

FIG. 1f depicts a flow chart of a method according to an embodiment. At step 140 an underfill material is provided. At step 142, at least one of a thiol adhesion promoter and an azole coupling agent is added to the underfill material. At step 144, a surface modified filler material is added to the underfill material, wherein the surface of the filler material is modified with at least one of a thiol adhesion promoter and an azole coupling agent. At step 146, a cross-linking polymer chemistry is added to the underfill material. At step 148, the underfill material comprising at least one of the thiol adhesion promoter, the azole coupling agent, the surface modified filler and the cross-linking polymer chemistry is formed around/on conductive bumps of a package structure.

Figure 2:
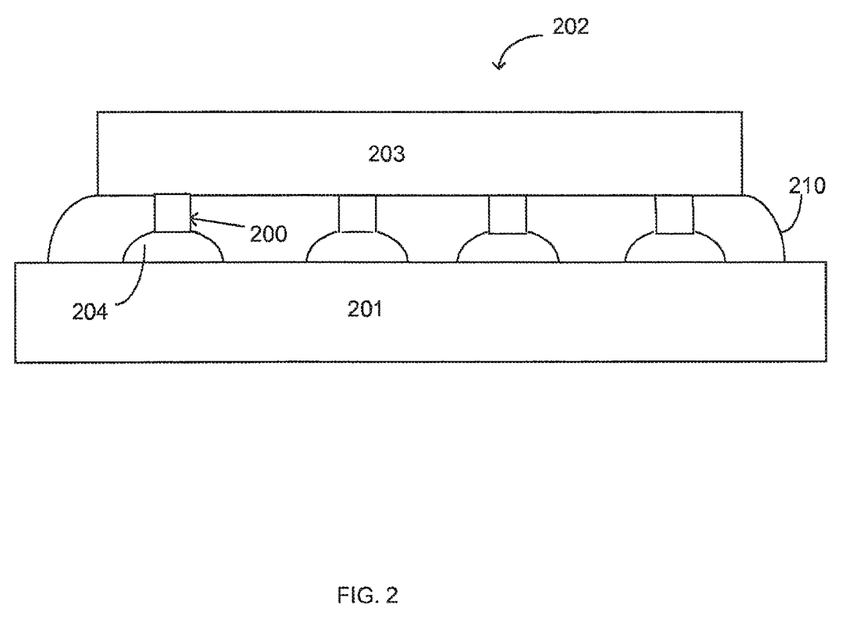
FIG. 2 represents a cross-sectional view of a structure according to various embodiments.

FIG. 2 (cross-sectional view), depicts a package structure 202, wherein conductive bumps 200 are disposed on a bottom surface of a device 203, and solder connections 204 disposed on a package substrate 201 are physically and electrically coupled with the conductive bumps 200. An underfill 210 material, similar to the underfill material 110 of the embodiments herein, surrounds the conductive bumps 200. In an embodiment, each of the conductive bumps 200 may comprise an electrically conductive terminal on the device (e.g., a pad, bump, stud bump, column, pillar, or other suitable structure or combination of structures).

The solder connections 204 may comprise electrically conductive terminals on the package substrate 201 (e.g., a pad, bump, stud bump, column, pillar, or other suitable structure or combination of structures). Solder (e.g., in the form of balls or bumps) may be disposed on the terminals of the substrate and/or die, and these terminals may then be joined using a solder reflow process, for example. Of course, it should be understood that many other types of interconnects and materials are possible (e.g., wirebonds extending between the device 203 and the substrate 201).

The conductive bumps 200 on the device 203 may comprise any suitable material or any suitable combination of materials, whether disposed in multiple layers or combined to form one or more alloys and/or one or more intermetallic compounds. For example, the conductive bumps 200 may include copper, aluminum, gold, silver, nickel, titanium, tungsten, as well as any combination of these and/or other metals. In other embodiments, a conductive bump 200 may comprise one or more non-metallic materials (e.g., a conductive polymer). The solder connections 204 may also comprise any suitable material or any suitable combination of materials, whether disposed in multiple layers or combined to form one or more alloys and/or one or more intermetallic compounds. For example, the solder connections 204 may include copper, aluminum, gold, silver, nickel, titanium, tungsten, as well as any combination of these and/or other metals.

Package structure 202 comprises improved adhesion between the conductive bumps 200 and the underfill material 210 due to the addition of at least one of the thiol adhesion promoter, the azole coupling agent, the surface modified filler and the cross linking polymer chemistry. The device 203 may comprise one of a microelectronic memory die and a central processing unit die in some cases, but may comprise any type of suitable device 203 according to the particular application in other cases. In an embodiment, the package structure 202 may comprise a coreless, bumpless build up layer (BBUL) package structure 202.

In the package structure of FIG. 2, the device 112 may be disposed in other locations, such as on a top surface of a BBUL package, for example, and the package structure 202 may comprise any suitable type of package structures capable of providing electrical communications between a microelectronic device, such as a die and a next-level component to which the package structures may be coupled (e.g., a circuit board). In another embodiment, the package structures herein may comprise any suitable type of package structures capable of providing electrical communication between a die and an upper integrated circuit (IC) package coupled with a lower IC package.

The package structures of the embodiments herein may comprise a multi-layer substrate—including alternating layers of a dielectric material and metal—built-up around a core layer (either a dielectric or metal core). In another embodiment, the package substrates may comprise a coreless multi-layer substrate. Other types of substrates and substrate materials may also find use with the disclosed embodiments (e.g., ceramics, sapphire, glass, etc.).

A device in the various Figures herein may comprise a silicon logic die or a memory die, for example, or any type of suitable microelectronic device/die, and may be disposed on a back side or on a front side of the package structures herein. In some embodiments the package structures may further comprise a plurality of dies, which may be stacked upon one another, depending upon the particular embodiment. In some cases the die(s) may be located/attached/embedded on either the front side, back side or on/in some combination of the front and back sides of the package structures. In an embodiment, the die(s) may be partially or fully embedded in the package structures of the embodiments.

The various embodiments of underfill structures included herein promote and improve adhesion and mechanical reliability for the package structures that utilize the underfill structures described herein. By modifying epoxy resin and filler surface, along with adding cross-linking polymer chemistries to the underfill material, adhesion is greatly enhanced in such underfill material package structures utilizing the embodiments herein.

Figure 3:
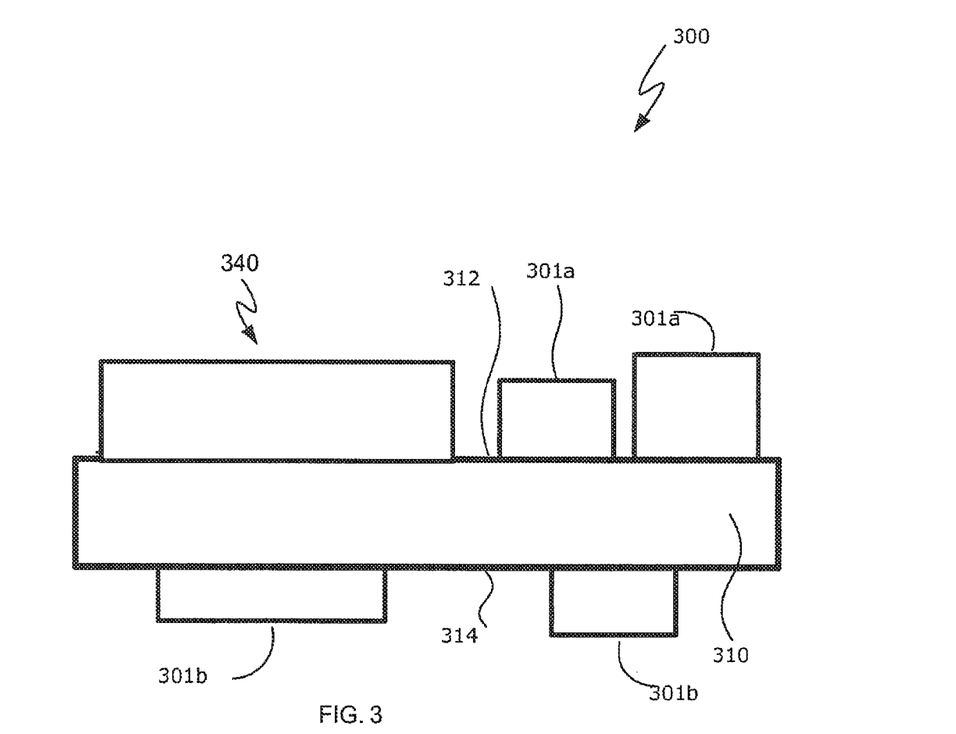
FIG. 3 represents a cross-sectional view of a system according to embodiments.

Turning now to FIG. 3 (cross-sectional view), illustrated is an embodiment of a computing system 300. The system 300 includes a number of components disposed on a mainboard 310 or other circuit board. Mainboard 310 includes a first side 312 and an opposing second side 314, and various components may be disposed on either one or both of the first and second sides 312, 314. In the illustrated embodiment, the computing system 300 includes a package structure 340 (which may be similar to the package structure 202 of FIG. 2, for example) disposed on the mainboard's first side 312, wherein the package structure 340 may comprise any of the underfill structure embodiments described herein.

System 300 may comprise any type of computing system, such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers.

Mainboard 310 may comprise any suitable type of circuit board or other substrate capable of providing electrical communication between one or more of the various components disposed on the board. In one embodiment, for example, the mainboard 310 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with the board 310. However, it should be understood that the disclosed embodiments are not limited to the above-described PCB and, further, that mainboard 310 may comprise any other suitable substrate.

In addition to the package structure 340, one or more additional components may be disposed on either one or both sides 312, 314 of the mainboard 310. By way of example, as shown in the figures, components 301a may be disposed on the first side 312 of the mainboard 310, and components 301b may be disposed on the mainboard's opposing side 314. Additional components that may be disposed on the mainboard 310 include other IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the computing system 300 includes a radiation shield. In a further embodiment, the computing system 300 includes a cooling solution. In yet another embodiment, the computing system 300 includes an antenna. In yet a further embodiment, the assembly 300 may be disposed within a housing or case. Where the mainboard 310 is disposed within a housing, some of the components of computer system 300—e.g., a user interface device, such as a display or keypad, and/or a power supply, such as a battery—may be electrically coupled with the mainboard 310 (and/or a component disposed on this board) but may be mechanically coupled with the housing.

Figure 4:
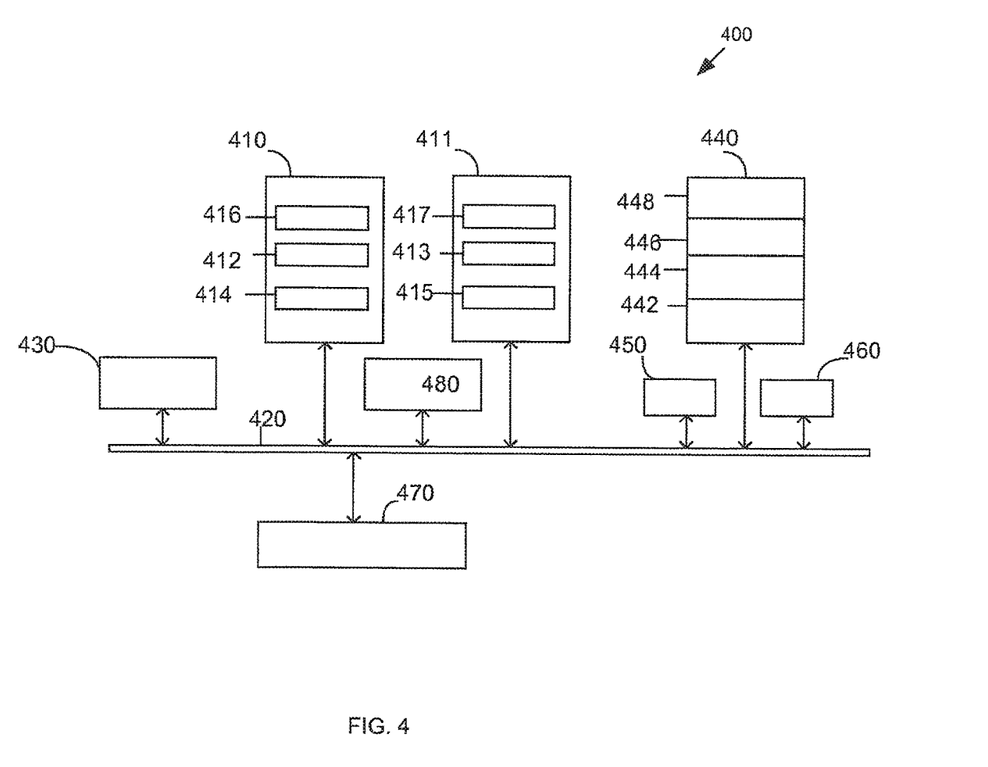
FIG. 4 represents a schematic of a system according to embodiments.

FIG. 4 is a schematic of a computer system 400 according to an embodiment. The computer system 400 (also referred to as the electronic system 400) as depicted can embody/include a package structure/underfill material that includes any of the several disclosed embodiments and their equivalents as set forth in this disclosure. The computer system 400 may be a mobile device such as a netbook computer. The computer system 400 may be a mobile device such as a wireless smart phone. The computer system 400 may be a desktop computer. The computer system 400 may be a hand-held reader. The computer system 400 may be integral to an automobile. The computer system 400 may be integral to a television.

In an embodiment, the electronic system 400 is a computer system that includes a system bus 420 to electrically couple the various components of the electronic system 400. The system bus 420 is a single bus or any combination of busses according to various embodiments. The electronic system 400 includes a voltage source 430 that provides power to the integrated circuit 410. In some embodiments, the voltage source 430 supplies current to the integrated circuit 410 through the system bus 420.

The integrated circuit 410 is electrically, communicatively coupled to the system bus 420 and includes any circuit, or combination of circuits according to an embodiment, including the package/device of the various embodiments included herein. In an embodiment, the integrated circuit 410 includes a processor 412 that can include any type of packaging structures according to the embodiments herein. As used herein, the processor 412 may mean any type of circuit such as, but not limited to, a microprocessor, a microcontroller, a graphics processor, a digital signal processor, or another processor. In an embodiment, the processor 412 includes any of the embodiments of the package structures disclosed herein. In an embodiment, SRAM embodiments are found in memory caches of the processor.

Other types of circuits that can be included in the integrated circuit 410 are a custom circuit or an application-specific integrated circuit (ASIC), such as a communications circuit 414 for use in wireless devices such as cellular telephones, smart phones, pagers, portable computers, two-way radios, and similar electronic systems. In an embodiment, the processor 412 includes on-die memory 416 such as static random-access memory (SRAM). In an embodiment, the processor 412 includes embedded on-die memory 416 such as embedded dynamic random-access memory (eDRAM).

In an embodiment, the integrated circuit 410 is complemented with a subsequent integrated circuit 411. In an embodiment, the dual integrated circuit 411 includes embedded on-die memory 417 such as eDRAM. The dual integrated circuit 411 includes an RFIC dual processor 413 and a dual communications circuit 415 and dual on-die memory 417 such as SRAM. The dual communications circuit 415 may be configured for RF processing.

At least one passive device 480 is coupled to the subsequent integrated circuit 411. In an embodiment, the electronic system 400 also includes an external memory 440 that in turn may include one or more memory elements suitable to the particular application, such as a main memory 442 in the form of RAM, one or more hard drives 444, and/or one or more drives that handle removable media 446, such as diskettes, compact disks (CDs), digital variable disks (DVDs), flash memory drives, and other removable media known in the art. The external memory 440 may also be embedded memory 448. In an embodiment, the electronic system 400 also includes a display device 450, and an audio output 460. In an embodiment, the electronic system 400 includes an input device such as a controller 470 that may be a keyboard, mouse, touch pad, keypad, trackball, game controller, microphone, voice-recognition device, or any other input device that inputs information into the electronic system 400. In an embodiment, an input device 470 includes a camera. In an embodiment, an input device 470 includes a digital sound recorder. In an embodiment, an input device 470 includes a camera and a digital sound recorder.

Although the foregoing description has specified certain steps and materials that may be used in the methods of the embodiments, those skilled in the art will appreciate that many modifications and substitutions may be made. Accordingly, it is intended that all such modifications, alterations, substitutions and additions be considered to fall within the spirit and scope of the embodiments as defined by the appended claims. In addition, the Figures provided herein illustrate only portions of exemplary microelectronic devices and associated package structures that pertain to the practice of the embodiments. Thus the embodiments are not limited to the structures described herein.

What is claimed is:

1. A method of forming a package structure comprising:
modifying a filler to have a surface comprising a thiol based adhesion promoter; and
subsequent to modifying the filler, adding the modified filler to an underfill material; and
forming the underfill material having the modified filler on conductive bumps of the package structure, wherein the thiol based adhesion promoter comprises a molecular weight above about 150 g/mol.

2. The method of claim 1 further comprising wherein the thiol based adhesion promoter comprises a silane.

3. The method of claim 2 further comprising wherein the silane comprises mercaptosilane, and wherein the mercaptosilane comprises electron withdrawing functional groups that remove electrons from the conductive bumps.

4. The method of claim 1 further comprising wherein the filler material comprises an azole coupling agent.

5. The method of claim 1 further comprising wherein the underfill material further comprises a peroxide cross linking chemistry.

6. The method of claim 1 further comprising wherein the filler is modified with at least one of mercaptosilane and carbonyl groups.

7. The method of claim 5 further comprising wherein the peroxide cross linking chemistry increases the amount of bonding to the conductive bump material.

8. The method of claim 4 further comprising wherein the azole based coupling agent forms coordinative bonds with the conductive bumps.

9. The method of claim 1 further comprising wherein the conductive bumps comprise copper.

10. The method of claim 6 further comprising wherein the underfill material comprises at least one of epoxy, cyanoacrylate, polyurethane, phenolics, and polyolefins, and wherein the filler material is modified with at least one of a benzotriazole, benzotriazole-5-carboxylic acid, imidazole, 8-azadenine, heterocyclic compounds comprising at least one of nitrogen or sulfur, polybenzimidazole, polybenzoxazole (PBO) or polybenzthiazole (PBT).

11. A method of forming a package structure comprising:
modifying a filler to have a surface comprising an azole based coupling agent and
subsequent to modifying the filler, adding the modified filler to an underfill material; and
forming the underfill material on conductive bumps of the package structure.

12. The method of claim 11 further comprising wherein the azole based coupling agent comprises at least one of benzotriazole, benzotriazole-5-carboxylic acid, imidazole, 8-azadenine, heterocyclic compounds comprising at least one of nitrogen or sulfur, polybenzimidazole, polybenzoxazole (PBO) or polybenzthiazole (PBT).

13. The method of claim 12 further comprising wherein the azole coupling agent may comprise precursors of PBO and PBT.

14. The method of claim 12 further comprising wherein the underfill material is cured, and wherein the PBO and PBT are co-cured with the underfill material.

15. The method of claim 11 further comprising wherein the underfill comprises at least one of cyanoacrylate, polyurethane, phenolics, or polyolefins.

16. The method of claim 15 further comprising wherein the filler comprises a thiol group.

17. The method of claim 16 further comprising wherein the filler is modified with at least one of electron withdrawal groups comprising carbonyl groups.

18. The method of claim 11 further comprising wherein the underfill material further comprises peroxide cross linking chemistry.

19. The method of claim 18 further comprising wherein the peroxide cross linking chemistry increases the amount of bonding to the conductive bump material.

20. The method of claim 11 further comprising wherein the azole based coupling agent forms coordinative bonds with the conductive bumps.

21. The method of claim 11 further comprising wherein the azole based coupling agent donates electrons to vacant d orbitals of the conductive bumps.

22. The method of claim 11 further comprising wherein the conductive bumps comprise copper.

23. The method of claim 11 further comprising wherein the conductive bumps couple the package structure to a device.

* * * * *